United States Patent
Reynolds et al.

(10) Patent No.: US 6,777,977 B1
(45) Date of Patent: Aug. 17, 2004

(54) THREE INPUT FIELD PROGRAMMABLE GATE ARRAY LOGIC CIRCUIT CONFIGURABLE AS A THREE INPUT LOOK UP TABLE, A D-LATCH OR A D FLIP-FLOP

(75) Inventors: Alan B. Reynolds, Long Valley, NJ (US); Andrew W. Reynolds, Stanhope, NJ (US); Volker Hecht, Barsinghausen (DE)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 10/137,729

(22) Filed: May 1, 2002

(51) Int. Cl.⁷ ................................. G06F 7/38
(52) U.S. Cl. ..................... 326/38; 326/39; 326/41
(58) Field of Search ...................... 326/38–41

(56) References Cited

U.S. PATENT DOCUMENTS

| | | | |
|---|---|---|---|
| 4,706,216 A | * 11/1987 | Carter | 365/94 |
| 4,758,745 A | 7/1988 | Elgamal et al. | 307/465 |
| 4,870,302 A | 9/1989 | Freeman | 307/465 |
| 5,132,571 A | 7/1992 | McCollum et al. | 307/465.1 |
| 5,451,887 A | 9/1995 | El-Ayat et al. | 326/39 |
| 5,570,041 A | 10/1996 | El-Ayat et al. | 326/41 |
| 5,999,015 A | * 12/1999 | Cliff et al. | 326/39 |
| 6,271,680 B1 | * 8/2001 | Mendel et al. | 326/40 |

* cited by examiner

Primary Examiner—Anh Q. Tran
(74) Attorney, Agent, or Firm—Sierra Patent Group, Ltd.

(57) ABSTRACT

A field programmable gate array logic cell includes a logic circuit having three inputs and at least one output and a plurality of multiplexers having inputs and outputs. The logic circuit also includes a plurality of programmable elements coupled between the three inputs and at least one output of the logic circuit and the inputs and outputs of the plurality of multiplexers such that a plurality of sequential logic units and combinatorial units can be realized by programming selected ones of the programmable elements, the sequential logic units may include a flip-flop.

18 Claims, 3 Drawing Sheets

US 6,777,977 B1

THREE INPUT FIELD PROGRAMMABLE GATE ARRAY LOGIC CIRCUIT CONFIGURABLE AS A THREE INPUT LOOK UP TABLE, A D-LATCH OR A D FLIP-FLOP

BACKGROUND OF THE INVENTION

1. Field of the Invention

The present invention relates to programmable integrated circuits. More particularly, the present invention relates to a programmable logic circuit and architecture for use in integrated circuits, such as field programmable gate array (FPGA) integrated circuits.

2. Background

A field-programmable gate array (FPGA) is an integrated circuit (IC) that includes an array of general-purpose logic circuits, called cells or logic blocks, whose functions are programmable. Programmable buses link the cells to one another. The cell types may be small multifunction circuits (or configurable functional blocks or groups) capable of realizing Boolean functions of multiple variables. The cell types are not restricted to gates. For example, configurable functional groups typically include memory cells and connection transistors that may be used to configure logic functions such as addition, subtraction, etc., inside of the FPGA. A cell may also contain a plurality of flip-flops. Two types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

Recent advances in user-programmable interconnect technology have resulted in the development of FPGAs which may be customized by a user to perform a wide variety of combinatorial and sequential logic functions. Numerous architectures for such integrated circuits are known. Examples of such architectures are found disclosed in U.S. Pat. No. 4,870,302 to Freeman, U.S. Pat. No. 4,758,745 to El Gamal et al., and U.S. Pat. No. 5,132,571 to McCollum et al. The architecture employed in a particular FPGA integrated circuit will determine the richness and density of the possible interconnections that can be made among the various circuit elements disposed on the integrated circuit and thus profoundly affect its usefulness.

While these circuits provide a degree of flexibility to the designer of user-programmable logic arrays, there is always a need for improvement of functionality of such circuits. In a typical logic cell with three input variables, there are at least seventy-eight potential functions resulting in different outputs. In addition, for each of the seventy-eight functions there are inverse functions created by inverting all data input lines. However, no one logic cell has been able to implement all seventy-eight potential functions. For instance, a prior art logic cell could implement a flip-flop, latch, or other three input function but not all three input logic functions, such as a three-input exclusive-OR or majority function (a function whose output represents the majority of the bits input).

BRIEF DESCRIPTION OF THE INVENTION

The present invention relates to FPGA architectures, and more specifically to the core architecture of an FPGA integrated circuit including the functional circuit modules, sometimes referred to as programmable logic modules, and the interconnect architecture which is used to define the programmable logic modules.

The present invention includes a logic cell including a logic circuit having three inputs and at least one output and a plurality of multiplexers having inputs and outputs. The logic circuit also includes a plurality of programmable elements coupled between the three inputs and at least one output of the logic circuit and the inputs and outputs of the plurality of multiplexers such that a plurality of sequential logic units and combinatorial units can be realized by programming selected ones of the programmable elements, the sequential units including a flip-flop.

DETAILED DESCRIPTION OF THE INVENTION

Those of ordinary skill in the art will realize that the following description of the present invention is illustrative only and not in any way limiting. Other embodiments will readily suggest themselves to such skilled persons in the art.

Figure 1:
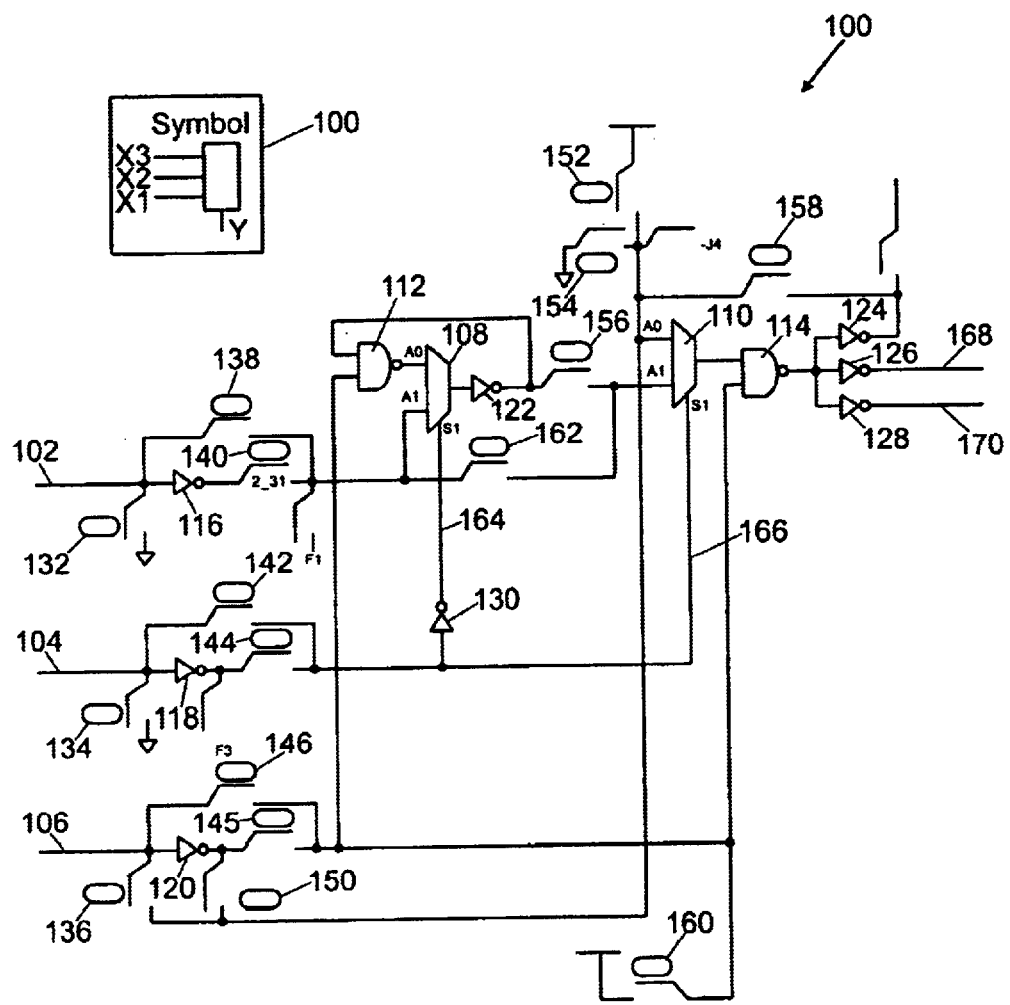
FIG. 1 is a schematic diagram of a prior art field programmable gate array core logic circuit.

FIG. 1 shows a schematic block diagram of a prior art logic circuit 100. Logic circuit 100 comprises a three-input logic cell having inputs 102, 104, and 106. Logic circuit 100 may comprise two two-input multiplexers 108, 110, two NAND gates 112, 114, eight inverters, 116, 118, 120, 122, 124, 126, 128, 130, and programmable elements 132, 134, 136, 138, 140, 142, 144, 146, 148, 150, 152, 154, 156, 158, 160, 162.

Multiplexer 108 has a first input that is coupled to data input line 106 through programmable element 146 and NAND gate 112. Inverter 120 may be selectively inserted into the circuit path between the first input of multiplexer 108 and data input line 106 by programming programmable element 148 and not programming programmable element 146. Multiplexer 108 has a second input coupled to data input line 102 through programmable element 138. Inverter 116 may be selectively inserted into the circuit path between the second input of multiplexer 108 and data input line 106 by programming programmable element 140 and not programming programmable element 138. Programmable elements 132 and 160 are used, in conjunction with programmable elements 138/140 and 146/148 respectively, to provide a known state when input nodes 102 or 106 are unused respectively. Multiplexer 108 has a control input line 164 coupled to data input line 104 through inverter 130 and programmable element 142. Inverter 118 is selectively inserted into the circuit path between the first input of multiplexer 108 and data input line 104 by programming programmable element 144 and not programming programmable element 142. Multiplexer 108 has an output coupled to the first input of NAND gate 112 through inverter 122, forming a latch.

Multiplexer 110 has a first input coupled to either power through programmable element 152 or ground through programmable element 154 or to the output of multiplexer 110 through NAND gate 114, inverter 124 and programmable element 158. When the output of multiplexer 110 is coupled to its own input, the circuit forms a latch. In yet another circuit, multiplexer 110 has a first input coupled to data input line 106 through programmable element 136. Inverter 120 is selectively inserted into the circuit path between multiplexer 110 and data input line 106 by programming programmable element 150 and not programming programmable element 136. Multiplexer 110 has a second input coupled to first data input line 102 through programmable elements 162 and 138. Inverter 116 is selectively inserted into the circuit path between the first input of multiplexer 10 and data input line 102 by programming programmable element 140 and not programming programmable element 138.

In an alternative circuit, multiplexer 110 has a second input coupled to the output of multiplexer 108 through inverter 122 and programmable element 156. Multiplexer 110 has a control input line 166 coupled to data input line 104 through programmable element 142. Inverter 118 is selectively inserted into the circuit path between the first input of multiplexer 108 and data input line 104 by programming programmable element 144 and not programming programmable element 142. Multiplexer 110 has an output coupled to data output line 168 through a first input of NAND gate 114 and inverter 126 and coupled to data output line 170 through NAND gate 114 and inverter 128.

NAND gate 114 has a second input coupled to data input line 106 through programmable element 146. Inverter 120 is selectively inserted into the circuit path between the first input of 114 and data input line 106 when programmable element 148 is programmed and programmable element 146 is not programmed. In an alternate circuit, the second input of NAND gate 114 can be tied to VCC (the power supply voltage) using programmable element 160 and programmable elements 146 and 148 are not programmed.

Although prior art circuit 100 is a multi-functional circuit configurable by programmable elements, it cannot implement all Boolean functions of three variables. For instance, prior art circuit can implement a look up table or a latch but cannot implement a D flip-flop. Thus, more than one logic cell is needed to implement all Boolean functions of three variables.

Figure 2:
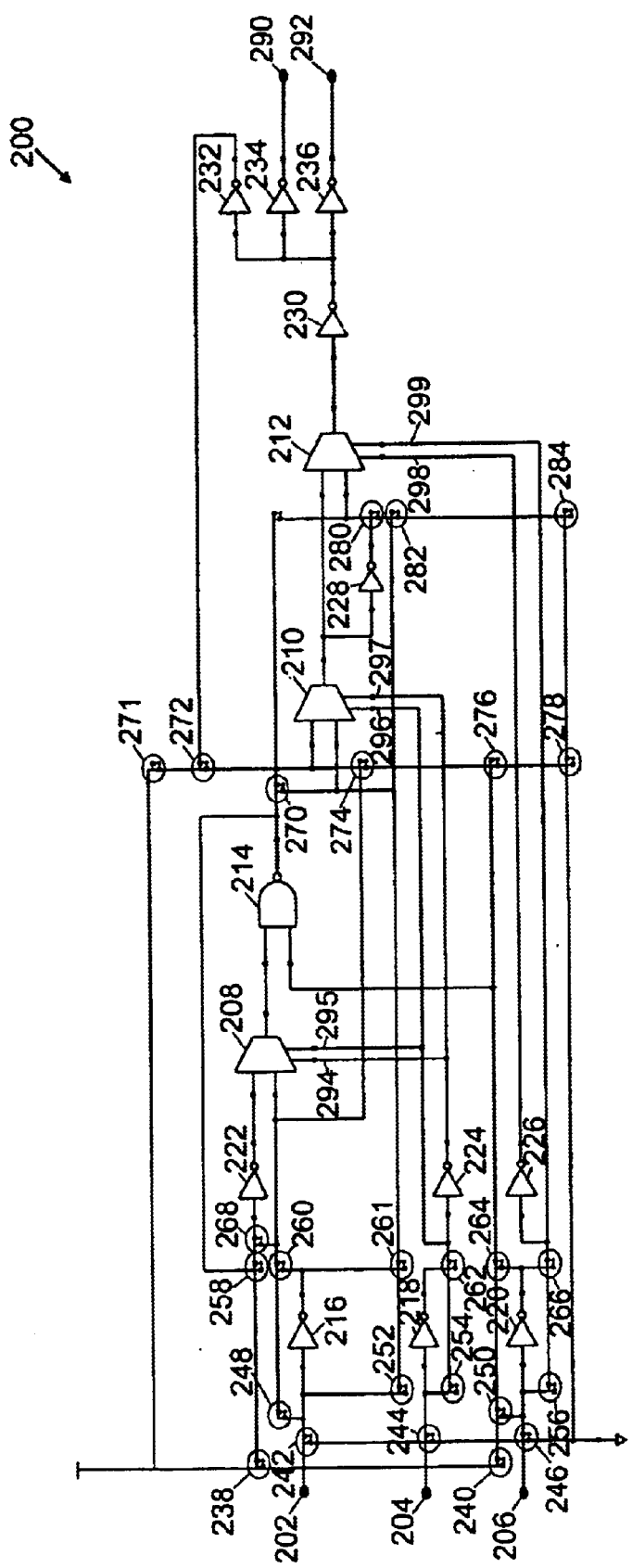
FIG. 2 is a schematic diagram of a field programmable gate array core logic circuit according to an embodiment of the present invention.

FIG. 2 is a schematic/block diagram of a logic circuit 200 according to an embodiment of the present invention. Logic circuit 200 comprises a three input logic cell having inputs 202, 204 and 206. Logic circuit 200 may comprise three two-input multiplexers 208, 210 and 212, one two-input NAND gate 214, eleven inverters 216, 218, 220, 222, 224, 226, 228, 230, 232, 234 and 236. Logic circuit 200 further comprises a plurality of user programmable elements 238, 240, 242, 244, 246, 248, 250, 252, 254, 256, 258, 260, 261, 262, 264, 266, 268, 270, 271, 272, 274, 276, 278, 280, 282, and 284. There are a number of available user-programmable element technologies, which may be employed in the architecture of the present invention. These include such elements as antifuses, and active devices, such as pass transistors. Such devices, their implementation, and the circuitry necessary to program them, are well known to those of ordinary skill in the art. The details of those known devices will not be set forth herein to avoid overcomplicating the disclosure and thus obscuring the nature of the present invention.

As known to those skilled in the art, every input that is not implemented as part of the user circuit must be coupled directly or via a programmable element to either VCC or ground so that all inputs are at a known state. Referring back to FIG. 2, Programmable elements 242, 244, 246, 278 and 284 are used to couple corresponding inputs to ground and programmable elements 238, 240, and 271 are used to couple corresponding inputs to VCC.

Because the of the presence of three two-input multiplexers 208, 210 and 212, NAND gate 214 inverters 216, 218, 220, 222, 224, 226, 228, 230, 232, 234 and 236 and user programmable elements 238, 240, 242, 244, 246, 248, 250, 252, 254, 256, 258, 260, 261, 262, 264, 266, 268, 270, 271, 272, 274, 276, 278, 280, 282, and 284, the versatility of logic cell 200 is greatly increased as will be appreciated by those of ordinary skill in the art. As will be set forth in greater detail below, three input logic cell 200 can be programmed using programmable elements to be a three-input look up table (LUT), a D-Latch, or a D flip-flop. Thus, logic cell 200 is highly configurable in that it can implement a flip-flop using the same logic elements that implement a LUT. This makes for an extremely flexible device. Also, if the selected programmable elements 238, 240, 242, 244, 246, 248, 250, 252, 254, 256, 258, 260, 261, 262, 264, 266, 268, 270, 271, 272, 274, 276, 278, 280, 282, and 284 are reprogrammable, as opposed to one time programmable, the same circuit can be programmed as a three-input LUT and then reprogrammed at a later date as a D flip-flop or other desirable user circuit.

Referring again to FIG. 2, multiplexer 208 has a first data input coupled to a first data input node 202 through inverter 222 and programmable elements 248 and 268. Inverter 216 is selectively inserted into the circuit path between data input line 202 and multiplexer 208 if programmable element 260 is programmed and 248 is not programmed. Multiplexer 208 has a second data input coupled to a first data input node 202 through programmable element 248. Inverter 216 is selectively inserted into the circuit path between data input line 202 and multiplexer 208 if programmable element 260 is programmed and 248 is not programmed.

Figure 3:
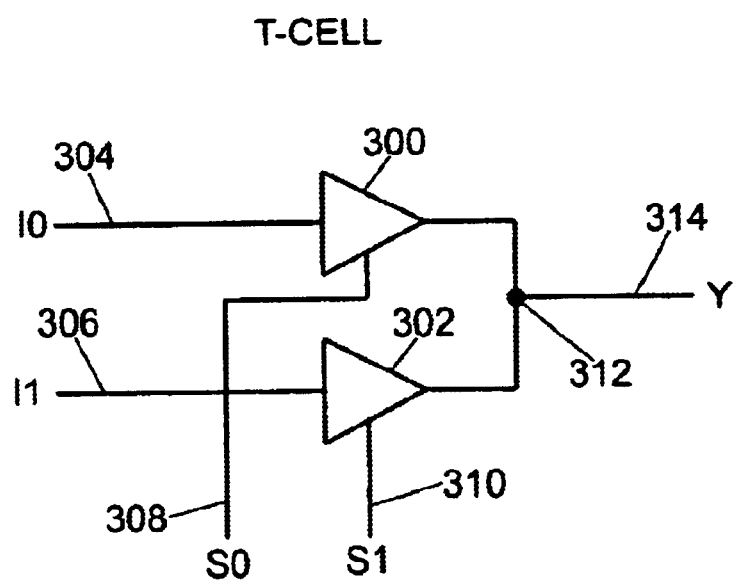
FIG. 3 is a schematic diagram of a T-cell type multiplexer.

As shown in FIG. 3, multiplexers 208, 210 and 212 are implemented using two buffers 300 and 302 each requiring its own control signal 308 and 310. There are a number of available multiplexer technologies, which may be employed in the architecture of the present invention. These include conventional and T-cell multiplexers. Such devices and their implementation are well known to those of ordinary skill in the art. The details of those known devices will not be set forth herein to avoid overcomplicating the disclosure and thus obscuring the nature of the present invention.

Referring back to FIG. 2, control input line 294 of multiplexer 208 is coupled to data,input line 204 through programmable element 254 and inverter 224. Inverter 218 is selectively inserted into the circuit path between control input line 294 and data input line 204 by programming programmable element 262 and not programming programmable element 254. Control input line 295 is coupled to data input line 204 through programmable element 254. Inverter 218 is selectively inserted into the circuit path between control input line 294 and data input line 204 by programming programmable element 262 and not programming programmable element 254.

Multiplexer 208 has an output coupled to a first input node of NAND gate 214. As stated above, when not in use programmable elements 242, 244 and 246 are programmed to couple corresponding inputs to ground so as to tie the inputs to a known state.

NAND gate 214 has a second input node coupled to third data input node 206 through programmable element 250. Inverter 220 is selectively inserted into the circuit between data input port 206 and the second input of NAND gate 214 by programming programmable element 264 and not programming programmable element 250. NAND gate 214 performs an asynchronous clear function when multiplexer 208 is used as a master latch in a D Flip-Flop. NAND gate 214 also implements a Boolean function of input nodes 202, 204, and 206.

A second two input multiplexer 210 has a first input coupled to the first data input node 202 through programmable elements 248 and 274. Inverter 216 is selectively inserted into the circuit path between data input line 202 and multiplexer 208 if programmable element 260 is programmed and 248 is not programmed. Multiplexer 210 has a second input port which is selectively coupled to the output port of NAND gate 214 when programmable element 270 is programmed. Second input port of multiplexer 210 may also be coupled to first data input port 202 through programmable element 252. Inverter 216 may be selectively inserted in the circuit paths between the second input port of multiplexer 210 and first data input port 202 if programmable element 261 is programmed and programmable element 252 is not programmed.

Control input line 296 is coupled to data input line 204 through programmable element 254. Inverter 218 is selectively inserted into the circuit path between control input line 294 and data input line 204 by programming programmable element 262 and not programming programmable element 254. Control input line 297 of multiplexer 210 is coupled to data input line 204 through programmable element 254 and inverter 224. Inverter 218 is selectively inserted into the circuit path between control input line 294 and data input line 204 by programming programmable element 262 and not programming programmable element 254.

Multiplexer 210 has an output coupled to a first input node of a third multiplexer 212. Also, the output of multiplexer 210 can be coupled to a second input node of multiplexer 212 through inverter 228 and programmable element 280.

In an alternative configuration, the second input node of multiplexer 212 can be coupled to first data input node 202 through programmable element 252. Inverter 216 is selectively inserted into the above circuit paths between first, input node 202 and the second input of multiplexer 212 by not programming programmable element 252 and programming programmable element 261.

Control input line 298 of multiplexer 212 is coupled to data input line 206 through programmable element 256 and inverter 226. Inverter 220 is selectively inserted into the circuit path between control input line 298 and data input line 206 by programming programmable element 266 and not programming programmable element 256. Control input line 299 is coupled to data input line 206 through programmable element 256. Inverter 220 is selectively inserted into the circuit path between control input line 298 and data input line 206 by programming programmable element 266 and not programming programmable element 256.

Multiplexer 212 has an output coupled to the input of inverter 230. Inverter 230 has an output connected to inverters 232, 234, and 236. The outputs of inverters 234 and 236 are coupled to data output ports 290 and 292. The output of inverter 232 may be fed back into the circuit to create a latch using programmable element 272.

Those of ordinary skill in the art will appreciate from the number of programmable elements present in the disclosed circuit, numerous other circuit paths are possible. The circuit paths set forth above are illustrative only and not in any way limiting.

One possible configuration of the above circuit is as a D flip-flop. Implementing two latches in a master-slave configuration creates a D flip-flop. A first latch is created by feeding the output of inverter 232 into the first input of multiplexer 210 by programming programmable element 272. This latch is known to those of ordinary skill in the art as a slave latch. A second latch is created by feeding the output of NAND gate 214 into the first input of multiplexer 208, by programming programmable element 258 and through inverter 222. This latch is known to those of ordinary skill in the art as a master latch. NAND gate 214 performs an asynchronous clear function when multiplexer 208 is used as a master latch in a D Flip-Flop. Finally, by programming programmable element 270 the master latch is connected to the slave latch forming the master-slave D flip-flop.

Another possible configuration other than the latches or D flip-flop discussed above is as a look-up table (LUT). A LUT is configured by programming the programmable elements as follows. Multiplexer 208 has a first data input coupled to a first data input node 202 through inverter 222 and programmable elements 248 and 268. Multiplexer 208 has a second data input coupled to a first data input node 202 through programmable element 248.

Control input line 294 of multiplexer 208 is coupled to data input line 204 through programmable element 254 and inverter 224. Control input line 295 is coupled to data input line 204 through programmable element 254. Multiplexer 208 has an output coupled to a first input node of NAND gate 214. As stated above, when not in use programmable elements 242, 244 and 246 are programmed to couple corresponding inputs to ground so as to tie the inputs to a known state.

NAND gate 214 has a second input node coupled to third data input node 206 through programmable element 250. NAND gate 214 also implements a Boolean function of input nodes 202, 204, and 206.

A second two input multiplexer 210 has a first input coupled to the first data input node 202 through programmable elements 248 and 274. Multiplexer 210 has a second input port which is selectively coupled to the output port of NAND gate 214 when programmable element 270 is programmed. Second input port of multiplexer 210 may also be coupled to first data input port 202 through programmable element 252.

Control input line 296 is coupled to data input line 204 through programmable element 254. Control input line 297 of multiplexer 210 is coupled to data input line 204 through programmable element 254 and inverter 224.

Multiplexer 210 has an output coupled to a first input node of a third multiplexer 212. Also, the output of multiplexer 210 can be coupled to a second input node of multiplexer 212 through inverter 228 and programmable element 280. In an alternative configuration, the second input node of multiplexer 212 can be coupled to first data input node 202 through programmable element 252.

Control input line 298 of multiplexer 212 is coupled to data input line 206 through programmable element 256 and inverter 226. Control input line 299 is coupled to data input line 206 through programmable element 256.

Multiplexer 212 has an output coupled to the input of inverter 230. Inverter 230 has an output connected to inverters 232, 234, and 236. The outputs of inverters 234 and 236 are coupled to data output ports 290 and 292.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A programmable logic cell, having three inputs and at least one output, comprising:
   at least three multiplexers, each multiplexer having an input and an output; and
   a plurality of programmable elements coupled to each of the at least three multiplexers and configured such that the at least three multiplexers, in combination, perform the function of any one of a D flip-flop, a D latch, or a three input LUT by programming selected ones of the plurality of programmable elements.

2. The programmable logic cell of claim 1 further comprising:
   a NAND gate coupled between at least two of said multiplexers; and
   a plurality of inverters coupled between said three inputs and at least one output of said logic circuit.

3. The programmable logic cell of claim 1 wherein the programmable elements comprise flash transistors.

4. The programmable logic cell of claim 1 wherein the programmable elements comprise antifuse elements.

5. The programmable logic cell of claim 1 wherein the programmable elements comprise MOS transistors.

6. A programmable logic cell, having three inputs and at least one output, comprising:
   a plurality of multiplexers;
   a plurality of inverters coupled to the plurality of multiplexers;
   at least one NAND gate coupled to the plurality of multiplexers; and
   a plurality of programmable elements coupled to the plurality of multiplexers, wherein:
      the combination of the plurality of inverters, the plurality of multiplexers, the at least one NAND gate and the plurality of programmable elements are capable of operating as a D flip-flop if a first set of the plurality of programmable elements is programmed;
      the combination of the plurality of inverters, the plurality of multiplexers the at least one NAND gate and the plurality of programmable elements are capable of operating as a D latch if a second set of the plurality of programmable elements is programmed; and
      the combination of the plurality of inverters, the plurality of multiplexers, the at least one NAND gate and the plurality of programmable elements are capable of operating as a look up table if a third set of the plurality of programmable elements is programmed.

7. The programmable logic cell of claim 6 further comprising:
   a NAND gate coupled between at least two of said multiplexers; and
   a plurality of inverters coupled between said three inputs and at least one output of said logic circuit.

8. The programmable logic cell of claim 6 wherein the programmable elements comprise flash transistors.

9. The programmable logic cell of claim 6 wherein the programmable elements comprise antifuse elements.

10. The programmable logic cell of claim 6 wherein the programmable elements comprise MOS transistors.

11. A field programmable gate array logic cell comprising:
    a logic circuit, having three inputs and at least one output, further comprising:
       a plurality of inverters coupled between said three inputs and at least one output of said logic circuit;
       a plurality of multiplexers, each having an input and an output, coupled to the plurality of inverters;
       at least one NAND gate programmably coupled between said plurality of multiplexers; and
       a plurality of programmable elements coupled to each of the at least three multiplexers and configured such that the at least three multiplexers, in combination, perform the function of any one of a sequential logic unit, including a flip-flop, and a combinatorial unit by programming selected ones of the plurality of programmable elements.

12. The programmable gate array logic cell of claim 11 wherein said combinatorial units include a look up table.

13. The programmable gate array logic cell of claim 11 wherein said sequential units include a D latch.

14. A method of programming a field programmable gate array logic cell, having three inputs and at least one output, comprising:
    providing a plurality of multiplexers, each multiplexer having an input and an output;
    providing a plurality of programmable elements coupled to the plurality of multiplexers; and
    programming selected ones of said programmable elements such that the plurality of multiplexers, in combination, perform the function of a sequential logic unit and a combinatorial unit.

15. The method of programming the programmable gate array logic cell according to claim 14 wherein selected ones of said programmable elements are programmed such that said combinatorial units include a look up table.

16. The method of programming the programmable gate array logic cell according to claim 14 wherein selected ones of said programmable elements are programmed such that said sequential units include a D latch.

17. A method of programming a field programmable gate array logic cell, having three inputs and at least one output, comprising:
    providing a plurality of inverters coupled between said inputs and outputs of said logic cell;
    providing a plurality of multiplexers, each one having an input and an output, coupled to the plurality of inverters;
    providing at least one NAND gate coupled to said plurality of multiplexers;
    providing a plurality of programmable elements coupled to said plurality of multiplexers; and
    programming selected ones of said programmable elements such that a combination of the plurality of multiplexers and the at least one NAND gate perform the function of a sequential logic unit, including a flip-flop, and a combinatorial unit.

18. A method of programming a logic cell including a plurality of programmable elements, comprising:
    selecting one of a D flip-flop, a D latch, and a look up table;
    selecting certain ones of the programmable elements to implement the selected one of said D flip-flop, D latch, and look up table;
    programming the selected ones of the programmable elements to implement the selected one of said D flip-flop, D latch, and look up table; and
    erasing at least one of said programmable elements;

selecting another one of a D flip-flop, a D latch, and a look up table;

selecting certain ones of the programmable elements to implement the selected another one of said D flip-flop, D latch, and look up table; and reprogramming at least one of said programmable elements such that at least another one of said D flip-flop, D latch, and look up table is implemented.

* * * * *